United States Patent
Sato

(10) Patent No.: US 9,353,714 B2
(45) Date of Patent: May 31, 2016

(54) MULTI-LAYER PIEZOELECTRIC ELEMENT, AND INJECTION DEVICE AND FUEL INJECTION SYSTEM USING THE SAME

(75) Inventor: Masahiro Sato, Kirishima-shi (JP)

(73) Assignee: KYOCERA CORPORATION, Kyoto-Shi (JP)

( * ) Notice: Subject to any disclaimer, the term of this patent is extended or adjusted under 35 U.S.C. 154(b) by 320 days.

(21) Appl. No.: 13/880,264

(22) PCT Filed: Oct. 28, 2011

(86) PCT No.: PCT/JP2011/074956
§ 371 (c)(1),
(2), (4) Date: May 28, 2013

(87) PCT Pub. No.: WO2012/057327
PCT Pub. Date: May 3, 2012

(65) Prior Publication Data
US 2013/0233278 A1    Sep. 12, 2013

(30) Foreign Application Priority Data
Oct. 28, 2010    (JP) .................................. 2010-242102

(51) Int. Cl.
*H01L 41/00*    (2013.01)
*H01L 41/22*    (2013.01)
(Continued)

(52) U.S. Cl.
CPC ....... *F02M 51/0603* (2013.01); *H01L 41/0472* (2013.01); *H01L 41/0475* (2013.01); *H01L 41/0838* (2013.01); *H01L 41/293* (2013.01)

(58) Field of Classification Search
CPC ............. F02D 9/00; F02D 1/12; F02D 41/32; F02M 69/18; F02M 59/447; F02B 3/06; H01L 41/39; B41J 2/1623; H03H 3/02

USPC ......... 123/465; 310/358, 357, 313 A, 323.06, 310/342; 29/25.35
See application file for complete search history.

(56) References Cited

U.S. PATENT DOCUMENTS 5,239,224 A    8/1993    Kimura et al.
6,414,417 B1 *    7/2002    Tsuyoshi ............ H01L 41/0472
                                                                310/366
(Continued)

FOREIGN PATENT DOCUMENTS

CN    1318965 A    10/2001
CN    101728479 A    6/2010
(Continued)

OTHER PUBLICATIONS

Chinese Office Action with English concise explanation, Chinese Patent Appln. No. 201180040867.4, Jun. 3, 2014, 9 pp.
(Continued)

*Primary Examiner* — Lindsay Low
*Assistant Examiner* — Syed O Hasan
(74) *Attorney, Agent, or Firm* — Volpe and Koenig, P.C.

(57) ABSTRACT

There are provided a multi-layer piezoelectric element which suppresses damage or separation of an external electrode and improves durability, as well as an injection device and a fuel injection system using the multi-layer piezoelectric element. A multi-layer piezoelectric element includes a stacked body including stacked piezoelectric bodies and internal electrodes, a conductor layer disposed coveringly on a side surface of the stacked body so as to be elongated in a stacking direction of the stacked body to electrically connect with ends of the internal electrodes, which are extended to the side surface of the stacked body, and an external electrode disposed on the conductor layer, one end in the stacking direction of the external electrode being a feeding end, a bonded region of the external electrode which is bonded to the conductor layer in an area near the feeding end being covered with a resin.

9 Claims, 7 Drawing Sheets

(51) Int. Cl.
*F02M 69/18* (2006.01)
*F02M 51/06* (2006.01)
*H01L 41/047* (2006.01)
*H01L 41/293* (2013.01)
*H01L 41/083* (2006.01)

(56) References Cited

U.S. PATENT DOCUMENTS

| | | | |
|---|---|---|---|
| 2001/0026114 A1* | 10/2001 | Takao et al. | 310/364 |
| 2001/0045792 A1 | 11/2001 | Takeshima | |
| 2001/0047796 A1 | 12/2001 | Yamada et al. | |
| 2003/0107301 A1 | 6/2003 | Asano et al. | |
| 2004/0085001 A1 | 5/2004 | Takeshima | |
| 2007/0164638 A1 | 7/2007 | Kadotani et al. | |
| 2008/0238264 A1* | 10/2008 | Nakamura | H01L 41/083 310/364 |
| 2010/0006678 A1* | 1/2010 | Sato | H01L 41/083 239/585.1 |
| 2010/0282874 A1 | 11/2010 | Nakamura et al. | |
| 2011/0026114 A1* | 2/2011 | Abe | G03B 21/58 359/461 |

FOREIGN PATENT DOCUMENTS

| | | |
|---|---|---|
| DE | 102005035158 A1 | 3/2006 |
| DE | 102008007202 A1 | 8/2009 |
| JP | 03270283 A | 12/1991 |
| JP | 04151884 A | 5/1992 |
| JP | 053351 A | 1/1993 |
| JP | 05145137 A | 6/1993 |
| JP | 2001069771 A | 3/2001 |
| JP | 2002061551 A | 2/2002 |
| JP | 2003-180090 A | 6/2003 |
| JP | 2010098027 A | 4/2010 |

OTHER PUBLICATIONS

International Search Report, PCT/JP2011/074956, Nov. 14, 2011, 2 pp.
Extended European Search Report, European Patent Application No. 11836460.3, Mar. 11, 2016, 6 pgs.

* cited by examiner

MULTI-LAYER PIEZOELECTRIC ELEMENT, AND INJECTION DEVICE AND FUEL INJECTION SYSTEM USING THE SAME

FIELD OF INVENTION

The present invention relates to a multi-layer piezoelectric element used for, for example, a driving element (piezoelectric actuator), a sensor element, and a circuit element, as well as to an injection device and a fuel injection system using the same.

BACKGROUND

There has heretofore been known a multi-layer piezoelectric element comprising: a stacked body including stacked piezoelectric bodies and internal electrodes; a conductor layer disposed coveringly on a side surface of the stacked body so as to be elongated in a stacking direction of the stacked body to electrically connect with ends of the internal electrodes extended to the side surface of the stacked body; and an external electrode disposed on the conductor layer so as to extend along the stacking direction (See Patent Literature 1).

Moreover, a lead is electrically connected to one end (feeding end) of the external electrode to electrically connect with an external circuit to receive current supply from an external power source.

CITATION LIST

Patent Literature

Patent Literature 1: Japanese Unexamined Patent Publication JP-A 2002-61551

SUMMARY

Technical Problem

In recent years, multi-layer piezoelectric elements have been required to have the capability of long-time continuous driving operation under high-voltage conditions, which has resulted in an increasing demand for long-time retention of displacement and improvement in durability. However, in the case of driving the above-described multi-layer piezoelectric element continuously under high-voltage conditions for a long period of time, a large electric current passes instantaneously through a portion for allowing the entry of electric current from the lead located at one end of the external electrode, with a consequent rise in temperature. Therefore, the bonded region of the external electrode, which is bonded to the conductor layer in an area near a feeding end, is prone to damage or separation.

The invention has been devised in view of the conventional problem as mentioned supra, and accordingly an object of the invention is to provide a multi-layer piezoelectric element which suppresses damage or separation of an external electrode and improves durability, as well as to provide an injection device and a fuel injection system using the multi-layer piezoelectric element.

Solution to Problem

The invention provides a multi-layer piezoelectric element including: a stacked body including stacked piezoelectric bodies and internal electrodes; a conductor layer disposed coveringly on a side surface of the stacked body so as to be elongated in a stacking direction of the stacked body to electrically connect with ends of the internal electrodes, which are extended to the side surface of the stacked body; and an external electrode disposed on the conductor layer, one end in the stacking direction of the external electrode being a feeding end, a bonded region of the external electrode, which is bonded to the conductor layer in an area near the feeding end, being covered with a resin.

The invention provides an injection device including: a container provided with an injection hole; and the multi-layer piezoelectric element of the invention, a fluid stored in the container being injected through the injection hole by driving the multi-layer piezoelectric element.

The invention provides an injection system including: a common rail configured to store a high-pressure fuel; the injection device of the invention, configure to inject the high-pressure fuel stored in the common rail; a pressure pump configured to supply the high-pressure fuel to the common rail; and an injection control unit configured to send a drive signal to the injection device.

Advantageous Effects of Invention

According to the multi-layer piezoelectric element of the invention, one end in the stacking direction of the external electrode is a feeding end, and the bonded region of the external electrode, which is bonded to the conductor layer in the area near the feeding end, is covered with a resin having large thermal capacity. Accordingly, heat can be accumulated in (absorbed by) the resin at the bonded end portion of the external electrode that undergoes generation of a large amount of heat. This makes it possible to suppress rapid temperature rise in the external electrode, and thus prevent the external electrode from damage, with consequent improvement in durability. Moreover, even when an amount of heat generation is large, the external electrode can be protected from damage due to breakage of the resin, rather than the external electrode. Further, since the strength of adhesion between the external electrode and the conductor layer at the bonded end portion can be enhanced, it never occurs that the multi-layer piezoelectric element suffers from damage due to separation of the external electrode. This helps increase the longevity of the multi-layer piezoelectric element.

DETAILED DESCRIPTION OF THE PREFERRED EMBODIMENTS

Hereinafter, an embodiment of a multi-layer piezoelectric element according to the invention will be described in detail with reference to the drawings.

Figure 1:
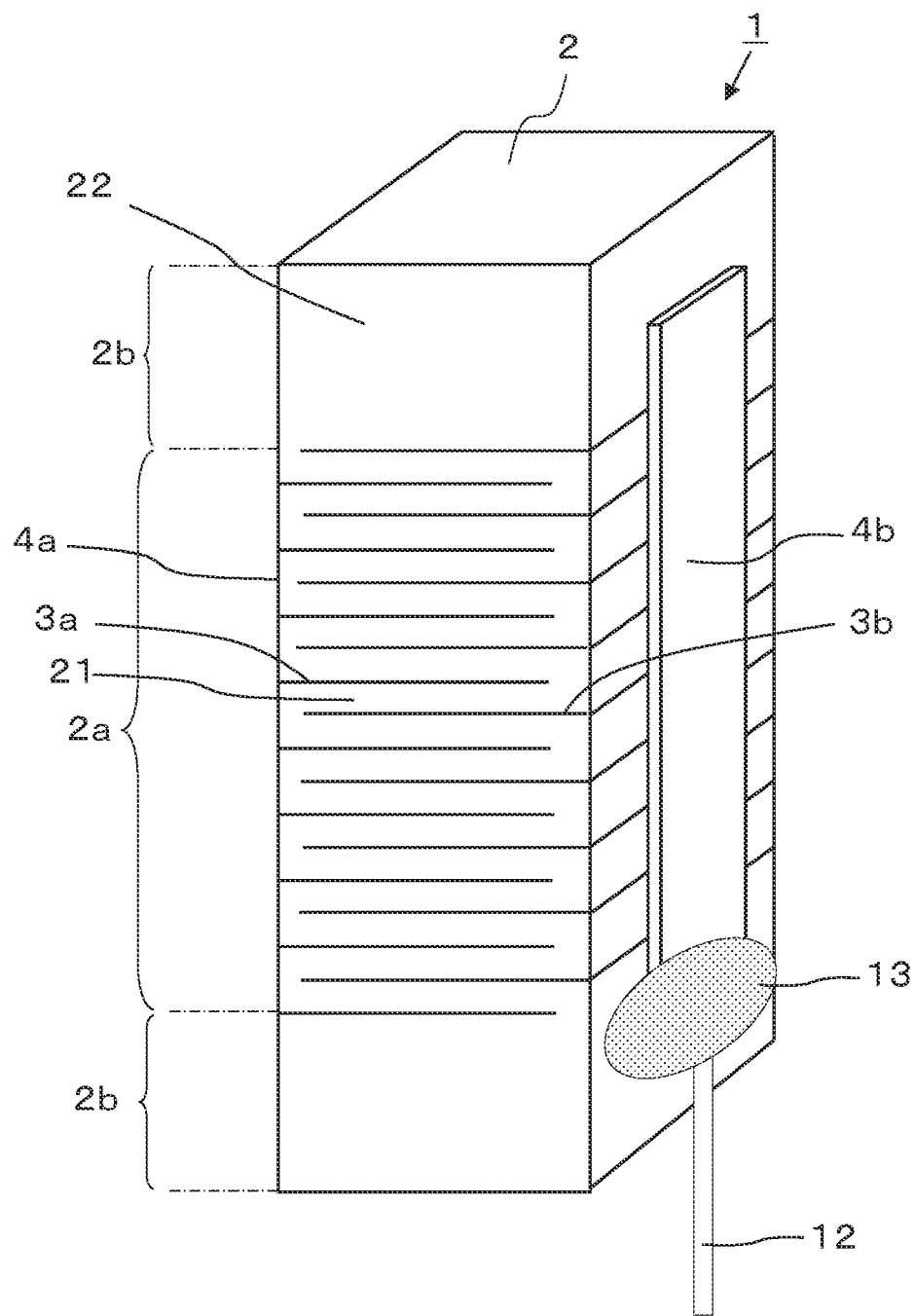
FIG. 1 is a perspective view showing an embodiment of a multi-layer piezoelectric element according to the invention.
Figure 2:
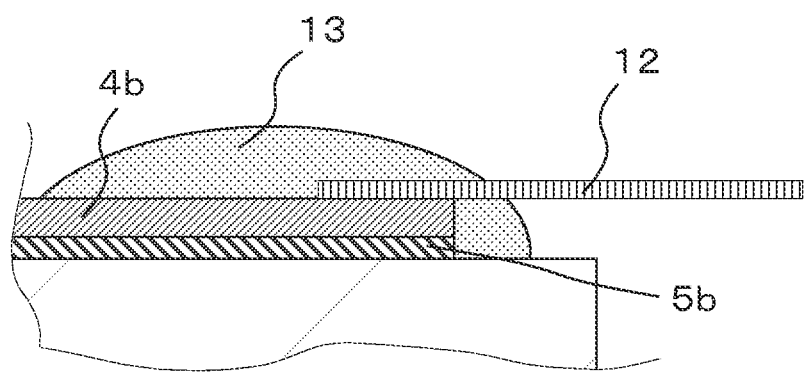
FIG. 2 is an enlarged sectional view showing a major part of the multi-layer piezoelectric element 1 shown in FIG. 1.

FIG. 1 is a perspective view showing an embodiment of a multi-layer piezoelectric element according to the invention, and FIG. 2 is an enlarged sectional view showing a major part of the multi-layer piezoelectric element 1 shown in FIG. 1.

The multi-layer piezoelectric element 1 shown in FIGS. 1 and 2 includes a stacked body 2 including stacked piezoelectric bodies 21 and internal electrodes 3a, 3b; conductor layers 5a and 5b each disposed coveringly on a side surface of the stacked body 2 so as to be elongated in a stacking direction of the stacked body to electrically connect with ends of the internal electrodes 3a, 3b extended to the side surface of the stacked body 2; and external electrodes 4a and 4b disposed on the conductor layers 5a and 5b, respectively. One end in the stacking direction of the external electrode 4a, 4b is a feeding end, and a bonded region of the external electrode 4a, 4b, which is bonded to the conductor layer in an area near the feeding end, is covered with a resin 13.

For example, the stacked body 2 is configured to include an active section 2a in which piezoelectric bodies 21 and internal electrodes 3a, 3b are alternately laminated, and inactive sections 2b arranged at both ends in the stacking direction of the active section 2a, each of the inactive sections being configured so that a plurality of piezoelectric bodies 21 are laminated. The stacked body 2 has the form of a column having a length of 0.5 to 10 mm, a width of 0.5 to 10 mm, and a height of 1 to 10 mm, for example. The end of the internal electrode 3a and the end of the internal electrode 3b are extended to the opposite side surfaces (opposed side surfaces), respectively, of the stacked body 2.

The piezoelectric body 21 is made of ceramics having a piezoelectric property. As such ceramics, for example, a perovskite-type oxide made of lead zirconate titanate (PZT: $PbZrO_3$-$PbTiO_3$), lithium niobate ($LiNbO_3$), lithium tantalate ($LiTaO_3$) or the like can be used.

The internal electrode 3a, 3b is formed by means of co-firing together with the ceramics constituting the piezoelectric body 21. As the material for forming the internal electrode, for example, a conductor composed predominantly of a silver-palladium alloy whose reactivity with piezoelectric porcelain is low, or a conductor containing copper, platinum, or the like can be used.

It is noted that the stacked body 2 may be configured to include a to-be-broken layer (not shown) which is preferentially broken rather than the internal electrode 3a, 3b during driving operation. There are placed a plurality of to-be-broken layers, preferably in a regularly-spaced arrangement, at least in one location between the layers of two or more piezoelectric bodies 21. The to-be-broken layer is designed as a layer which is lower in strength than the internal electrode 3a, 3b and is thus prone to cracking under stress and provides stress reduction capability. For example, the to-be-broken layer is made of an insufficiently-sintered piezoelectric layer, a piezoelectric layer or metallic layer bearing many porosities, or a layer containing independently-distributed piezoelectric particles and metallic particles. The provision of such a to-be-broken layer makes it possible to prevent the internal electrode 3a, 3b and the piezoelectric body 21 from cracking, because the to-be-broken layer becomes cracked preferentially when tensile stress is exerted in the stacking direction of the stacked body 2 as the result of expansion of the stacked body 2.

As shown in FIG. 2, on the side surface of the stacked body 2 is coveringly disposed the conductor layer 5a, 5b so as to be elongated in the stacking direction to electrically connect with the ends of the internal electrodes 3a, 3b extended to that side surface. More specifically, the conductor layer 5a is electrically connected to the end of the internal electrode 3a extended to its respective side surface of the stacked body 2, and the conductor layer 5b is electrically connected to the end of the internal electrode 3b extended to its respective side surface of the stacked body 2. Note that the conductor layer 5a is omitted in FIG. 2.

The conductor layer 5a, 5b is made of an electrically conducting material such as silver, and preferably contains a glass component additionally for the sake of enhancing its adhesion to the stacked body 2. For example, the conductor layer 5a, 5b can be formed by application of a paste made of silver and glass with subsequent baking process. The thickness of the conductor layer 5a, 5b falls within the range of 10 to 500 µm.

The external electrode 4a, 4b is bonded to the conductor layer 5a, 5b. More specifically, the external electrode 4a is bonded to the conductor layer 5a by an electrically conducting bonding material (not shown), and the external electrode 4b is bonded to the conductor layer 5b by an electrically conducting bonding material (not shown). Note that the external electrode 4a and the conductor layer 5a are omitted in FIGS. 1 and 2.

While solder (preferably, lead-free solder in view of environmental friendliness) and electrically conducting resin can be used for the electrically conducting bonding materials, the use of electrically conducting resin is desirable from the standpoints of heat resistance, adaptability to expansion and contraction of the stacked body 2, high strength of adhesion to the resin 13 as will hereafter be described, and minimization of the possibility of separation of the resin 13. The thickness of each of the electrically conducting bonding materials falls within the range of 5 µm to 500 µm.

The external electrode 4a, 4b is a platy electrode made of metal such as copper, iron, stainless steel, or phosphor bronze, and has a width of 0.5 to 10 mm and a thickness of 0.01 to 1.0 mm, for example. The external electrode 4a, 4b is connected, at its one end in the stacking direction (feeding end), to an external circuit. That one end (feeding end) is connected with a lead (for example, a lead pin 12) via the above-described electrically conducting bonding material (not shown) or by means of welding. The external electrode 4a, 4b is preferably made to have slits, or have a meshed configuration or corrugated configuration in the interest of adaptability to expansion and contraction of the stacked body 2. The thickness is preferably in a range of from 10 to 500 µm, and in particular from 50 to 200 µm. Moreover, the external electrode 4a, 4b can be plated with tin or silver to improve the electrical conductivity and thermal conductivity.

As shown in FIGS. 1 and 2, the bonded region of the external electrode 4a, 4b, which is bonded to the conductor layer 5a, 5b in the area near one end (feeding end), is covered with the resin 13.

The connected portion of the external electrode 4a, 4b which is connected to the lead pin 12 and is positioned at one end is a portion for allowing the entry of electric current that is most susceptible to heat generation. Correspondingly, the bonded end portion of the external electrode 4a, 4b, which is bonded to the conductor layer 5a, 5b in the area near one end, undergoes a large amount of heat generation. For example, stainless steel is preferable to phosphor bronze from the viewpoint of ensuring adequate strength in the external electrode 4a, 4b when it is made thinly. However, when the external electrode 4a, 4b is made thin using stainless steel, it will be of higher resistance, which leads to an increase in the amount of heat generation (temperature rise). In this regard, by placing the resin 13 so that it covers the bonded region (bonded end portion) of the external electrode 4a, 4b which is bonded to the conductor layer 5a, 5b in the area near one end (feeding end), the heat evolved at the bonded end portion which undergoes a large amount of heat generation can be accumulated in (absorbed by) the resin. This makes it possible to suppress rapid temperature rise in the external electrode 4a, 4b and thus prevent the external electrode 4a, 4b from damage, with consequent improvement in durability. Moreover, even when an amount of heat generation is large, the external electrode 4a, 4b can be protected from damage due to breakage of the resin 13, rather than the external electrode 4a, 4b. Further, since the strength of adhesion between the external electrode 4a, 4b and the conductor layer 5a, 5b at the bonded end portion can be enhanced, it never occurs that the multi-layer piezoelectric element suffers from damage due to separation of the external electrode 4a, 4b. This helps increase the longevity of the multi-layer piezoelectric element.

It is noted that placement of the resin 13 to cover the connected portion of the external electrode 4a, 4b which is connected to the lead pin 12 and is positioned at one end (feeding end) is effective at suppressing rapid temperature rise in the external electrode 4a, 4b. Moreover, setting of the resin 13 to be larger in width than the external electrode 4a, 4b, as well as placement of the resin 13 to cover, in addition to the external electrode 4a, 4b, the conductor layer 5a, 5b, is effective at suppressing separation of the external electrode 4a, 4b.

While epoxy-based resin, amide-based resin, silicone-based resin, or the like can be used for the resin 13, epoxy-based resin is desirable because of its high heat resistance and high adherability to porcelain. The use of epoxy-based resin makes it possible to prevent occurrence of damage and separation resulting from heat generation, and thereby attain a longer service life. Moreover, the thickness of the resin 13 is from 10 to 500 μm, and preferably from 50 to 200 μm. If the thickness is less than 10 μm, the heat-accumulation effect (heat-absorption effect) and the effect of adherability of the resin 13 will be impaired. If the thickness exceeds 500 μm, the resin 13 will be prone to separation due to the difference in thermal expansion between the resin 13 and the external electrode 4a, 4b.

Figure 3:
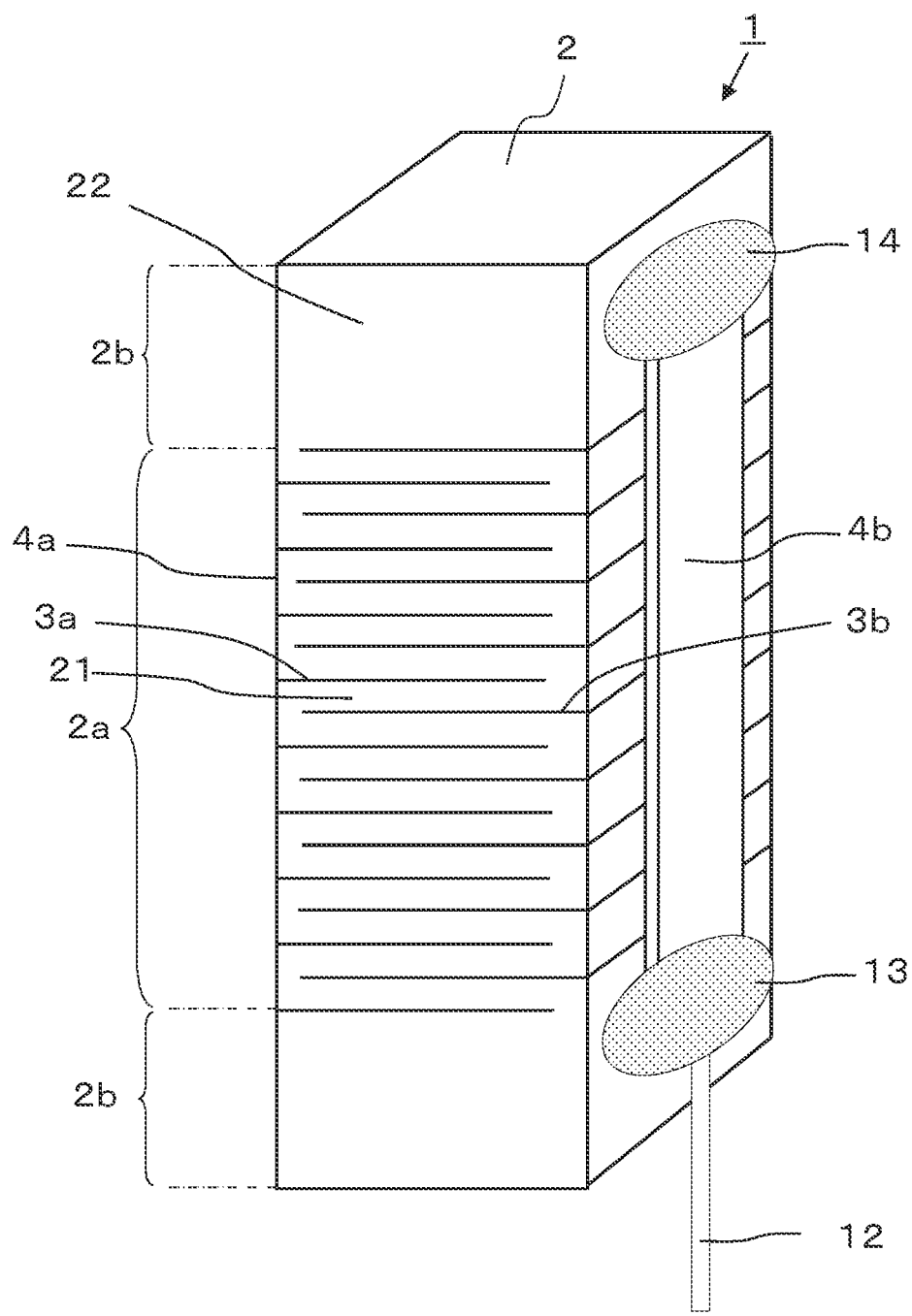
FIG. 3 is a perspective view showing another embodiment of the multi-layer piezoelectric element according to the invention.

Moreover, in the multi-layer piezoelectric element 1, it is preferable that, as shown in FIG. 3, a bonded region of the external electrode 4a, 4b, which is bonded to the conductor layer 5a, 5b in an area near another end opposite to the feeding end, is covered with a resin 14. Thereby, the bonded region positioned near the opposite end which is prone to separation also becomes resistant to separation by virtue of improved heat-accumulation capability and adherability, wherefore the longevity can be increased even further.

In this case, the bonded regions of the external electrode 4a, 4b bonded to the conductor layer 5a, 5b are covered with the resin 13 and the resin 14, respectively, whereas any regions other than the bonded regions of the external electrode 4a, 4b bonded to the conductor layer 5a, 5b are not covered with the resin 13 as well as the resin 14. This makes it possible to suppress damage or separation of the external electrode 4a, 4b resulting from heat generation while permitting freedom of expansion and contraction of the stacked body 2.

Moreover, in the multi-layer piezoelectric element 1, the resin 13, 14 is disposed at the inactive section 2b which includes stacked piezoelectric bodies 21 but does not include the internal electrodes 3a, 3b (inactive section 2b of poor thermal conductivity). In this case, the resin is capable of producing better heat-accumulation effect (heat-absorption effect) in the inactive section 2b insensitive to an instantaneous temperature change, wherefore the longevity can be increased. Further, since the inactive section 2b does not undergo expansion and contraction, it follows that the resin 13, 14 and the stacked body 2 (piezoelectric bodies) adhere firmly to each other and are thus less prone to mutual separation, with consequent improvement in durability.

Moreover, in the case where the stacked body 2 is configured to include the active section 2a in which piezoelectric bodies 21 and internal electrodes 3a, 3b are alternately laminated, and the inactive sections 2b arranged at both ends of the active section 2a, each of the inactive section 2b including the piezoelectric bodies 21, the multi-layer piezoelectric element 1 can be so designed that the conductor layer 5a, 5b and the external electrode 4a, 4b are each extended from the active section 2a to the inactive section 2b, and the resin 13, 14 lies across the active section 2a and the inactive section 2b. This makes it possible to suppress expansion of the active section 2a in the vicinity of the interface between the active section 2a and the inactive section 2b, and thereby lessen the stress occurring at the interface due to the difference in expansion and contraction between the active section 2a and the inactive section 2b. Accordingly, the longevity can be increased even further.

Figure 4:
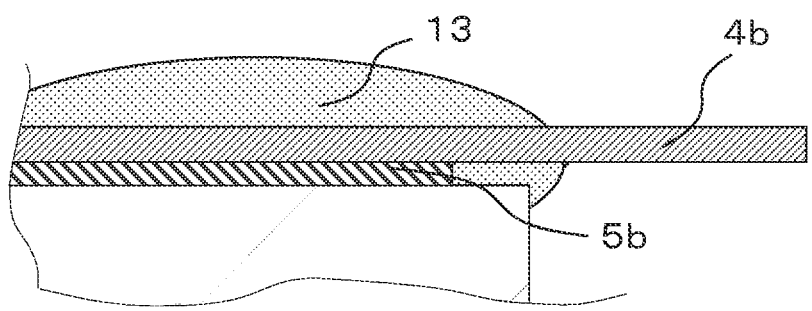
FIG. 4 is an enlarged sectional view showing the major part of another embodiment of the multi-layer piezoelectric element according to the invention.

Further, as shown in FIG. 4, in the multi-layer piezoelectric element 1, in the case where the external electrode 4a, 4b is so disposed as to have a protrusion on its feeding-end side, the protrusion extending beyond an end face of the stacked body 2, it is preferable that part of the end face of the stacked body 2 and part of the protrusion of the external electrode 4a, 4b are bonded to each other by the resin 13, 14. According to this structure, the area of contact between the resin 13, 14 and the external electrode 4a, 4b can be increased, with a consequent increase in the amount of heat accumulation (the amount of heat absorption). This makes it possible to suppress rapid heat generation and thereby prevent the external electrode 4a, 4b from damage. Accordingly, the longevity can be increased.

Figure 5:
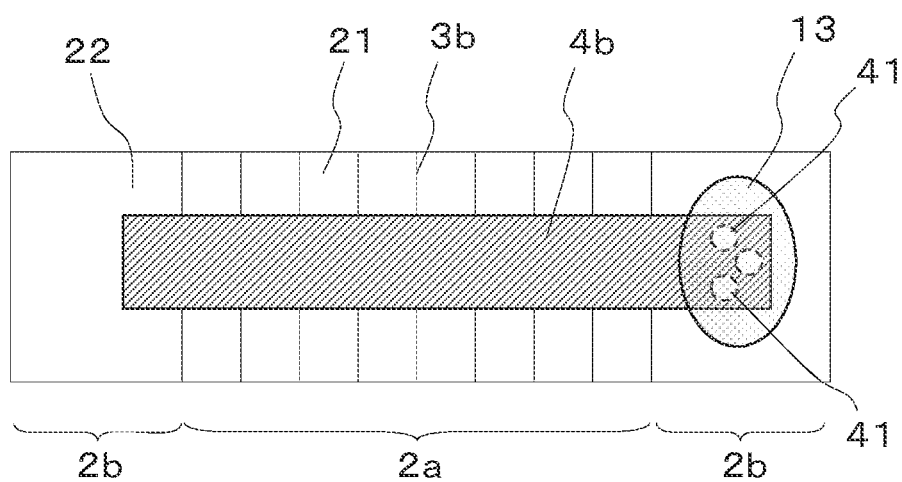
FIG. 5 is a transparent plan view of the major part of another embodiment of the multi-layer piezoelectric element according to the invention.

In addition, as shown in FIG. 5, the multi-layer piezoelectric element 1 is configured to form the bonded end portion of the external electrode 4a, 4b with a hole 41, the hole 41 being filled with the resin 13. Note that FIG. 5 is a plan view illustrating the external electrode 4b-bearing surface of the construction as a top surface, assuming that the resin 13 is transparent. It is preferable that a diameter of the hole 41 is from 0.1 to 1 mm, the number of the hole 41 is from 1 to 10, and the spacing between the adjacent holes 41 is from 0.1 to 0.5 mm from the standpoints of strength enhancement and electric conduction. According to this structure, the volume of the resin and the area of contact between the resin and the external electrode can be increased, with a consequent increase in the amount of heat accumulation (the amount of heat absorption). Moreover, cross-linkage between upper and lower resins can be increased, with a consequent increase in the strength of adhesion between the external electrode and the conductor layer. This makes it possible to suppress damage or separation of the external electrode, and thereby increase the longevity.

Next, a method for manufacturing the multi-layer piezoelectric element 1 in accordance with one embodiment of the invention will be described. First, for example, powder of PZT (lead zirconate titanate), a binder made of organic high polymer such as acrylic polymer or butyral polymer, and a plasticizer such as DBP (dibutyl phthalate) or DOP (dioctyl phthalate) are mixed to prepare a slurry.

Subsequently, the slurry thus prepared is shaped into ceramic green sheets by a tape molding technique such as the doctor blade method or calender roll method.

Next, an electrically conducting paste for forming the internal electrodes 3a and 3b is prepared. The electrically conducting paste is obtained by admixing a binder, a plasticizer, and so forth in metal powder composed predominantly of a silver-palladium alloy. The electrically conducting paste is printed onto one side of the ceramic green sheet in a pattern of an internal electrode 3a, 3b by means of screen printing or otherwise.

Next, a primary stacked compact is obtained by stacking the ceramic green sheets having the printed electrically conducting paste on top of each other in a configuration of, for example, the active section 2a as shown in FIG. 1 with subsequent drying process. Then, a stack of a plurality of printed electrically conducting paste-free ceramic green sheets for constituting the inactive sections 2b are placed at both ends in the stacking direction of the primary stacked compact. In this way, a stacked compact is prepared. Note that the stacked compact can be cut along the stacking direction to obtain a desired shape on an as needed basis.

Next, the stacked compact is subjected to binder removal treatment at a predetermined temperature, and is whereafter fired at a temperature in a range of 900 to 1150° C. In this way, a stacked body 2 in the form of a column is obtained. It is possible to grind the side surface of the stacked body 2 on an as needed basis.

Next, the conductor layer 5a, 5b is disposed on the side surface of the stacked body 2. The conductor layer 5a, 5b can be formed by preparing an electrically conducting paste by admixing a binder, a plasticizer, glass powder, and so forth in metal powder composed predominantly of silver, printing the electrically conducting paste onto the side surface of the stacked body 2 by means of screen printing or otherwise, and performing firing at a temperature in a range of 600 to 800° C. Moreover, a plate-like or mesh-patterned external electrode 4a, 4b made of an electrically conducting material is placed on an outer surface of the conductor layer 5a, 5b for connection with an external power source. The external electrode 4a, 4b is bonded to the conductor layer by an electrically conducting bonding material (solder or electrically conducting adhesive).

After that, a lead is connected to the external electrode 4a, 4b by means of soldering, welding, or otherwise. Then, the bonded end portion of the external electrode bonded to the conductor layer is coated with resin such as epoxy resin by an applicator such as a dispenser, and the resin is cured at a curing temperature which is determined according to the type of resin material. In this way, the multi-layer piezoelectric element 1 of the invention is obtained.

By the manufacturing method thus far described, it is possible to obtain the multi-layer piezoelectric element which suppresses breakage of the external electrode and improves durability.

Figure 6:
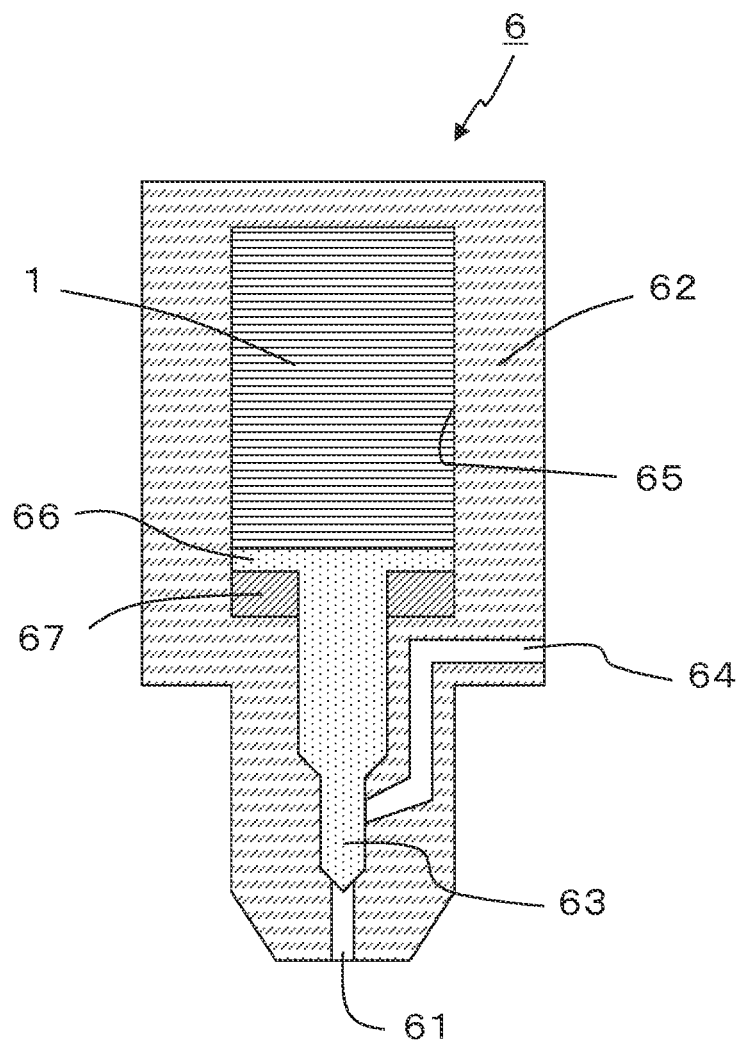
FIG. 6 is a schematic sectional view showing an injection device in accordance with an embodiment of the invention.

FIG. 6 is a schematic sectional view showing an injection device in accordance with one embodiment of the invention. As shown in FIG. 6, an injection device 6 of this embodiment includes a housing 62 including an injection hole 61 at one end thereof and the above-described multi-layer piezoelectric element 1 placed within the housing 62. In an interior of the housing 62 is disposed a needle valve 63 capable of opening and closing of the injection hole 61 by driving the multi-layer piezoelectric element 1. A fuel passage 64 is so disposed as to be capable of communicating with the injection hole 61 in accordance with the movement of the needle valve 63. The fuel passage 64 is coupled to an external fuel supply source, so that a fuel is supplied to the fuel passage 64 under high pressure at all times. Therefore, when the needle valve 63 is operated to open the injection hole 61, then a fuel which has been fed through the fuel passage 64 is injected to a fuel chamber of an internal combustion engine (not shown) with constant high pressure.

Further, an upper end of the needle valve 63 is a piston 66 which can slide along a cylinder 65 which has an increased inner diameter and is provided in the housing 62. Furthermore, the above-described multi-layer piezoelectric element 1 is placed within the housing 62 in contact with the piston 66.

In the injection device 6 thus constructed, upon extension of the multi-layer piezoelectric element 1 entailed by application of voltage, the piston 66 is pushed forward, thus causing the needle valve 63 to close the injection hole 61 with a consequent halt on supply of fuel. Further, upon stopping the application of voltage, the multi-layer piezoelectric element 1 is contracted, and a disc spring 67 pushes the piston 66 backward. In consequence, the injection hole 61 communicates with the fuel passage 64 so that injection of fuel is carried out.

It is noted that the injection device 6 may include a housing provided with an injection hole 61 and the multi-layer piezoelectric element 1, a fluid stored in the housing 62 being injected through the injection hole by driving the multi-layer piezoelectric element 1. That is, the multi-layer piezoelectric element 1 does not necessarily have to be placed within the housing 62. It is sufficient only that a pressure for control of fluid injection is applied to the interior of the housing 62 by driving the multi-layer piezoelectric element 1. In this embodiment, the term "fluid" is construed as encompassing not only fuel and ink, but also various liquid fluid (such as a conductive paste).

Figure 7:
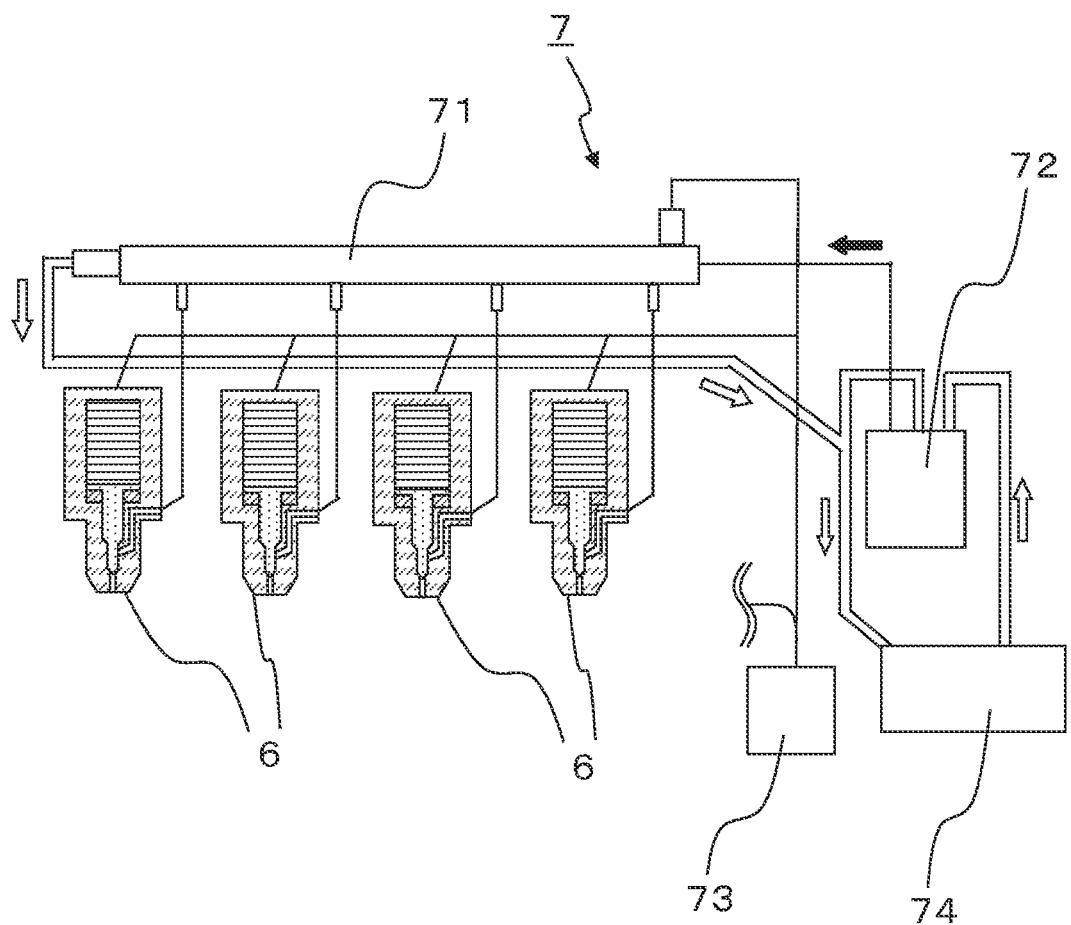
FIG. 7 is a schematic block diagram showing a fuel injection system in accordance with an embodiment of the invention.

FIG. 7 is a schematic diagram showing the fuel injection system according to an embodiment of the invention. As shown in FIG. 7, a fuel injection system 7 according to the embodiment of the invention includes a common rail 71 configured to store a high-pressure fuel, a plurality of injection devices 6 each configured to inject a high-pressure fuel stored in the common rail 71, a pressure pump 72 configured to supply the high-pressure fuel to the common rail 71, and an injection control unit 73 configured to send a drive signal to the injection device 6.

The injection control unit 73 controls an amount of injection of the high-pressure fuel and timing of fuel injection while detecting the condition of the interior of the combustion chamber of an engine by a sensor or the like. The pressure pump 72 plays a role of supplying a fuel from a fuel tank 74 to the common rail 71 under pressure of about 1000 to 2000 atmospheres (about 101 MPa to about 203 MPa), and preferably pressure of about 1500 to 1700 atmospheres (about 152 MPa to about 172 MPa). The common rail 71 stores therein the fuel from the pressure pump 72 and acts to feed it to the injection device 6 on an as needed basis. The injection device 6 injects a small amount of fuel into the combustion chamber through the injection hole 61, as mentioned above.

When using the fuel injection system 7 of this embodiment, it is possible to stably inject the high pressure fuel as desired for a longer period of time than the case of a conventional fuel injection system.

EXAMPLES

Hereinafter, practical examples of the multi-layer piezoelectric element of the invention will be described.

To begin with, a slurry was prepared by mixing calcined powder of piezoelectric ceramic composed predominantly of PZT, a binder made of organic high polymer, and a plasticizer.

The slurry was shaped into 150 μm-thick ceramic green sheets by the slip casting technique.

Then, powder of a silver-palladium alloy having a silver content of 70% by mass and a palladium content of 30% by mass was printed, in a desired pattern with a thickness of 5 μm, onto one side of the ceramic green sheet by screen printing, thereby forming an electrically-conducting paste layer.

Next, after the electrically-conducting paste layer was dried, 100 ceramic green sheets having the coating of the electrically-conducting paste layer were stacked on top of each other to form a primary stacked compact. In addition, a stack of 20 electrically-conducting paste layer-free ceramic green sheets was placed at the upper end in the stacking direction of the primary stacked compact, and also a stack of 20 electrically-conducting paste layer-free ceramic green sheets was placed at the lower end in the stacking direction of the primary stacked compact. In this way, a stacked compact was formed.

Next, the stacked compact was subjected to pressure while being heated at a temperature of 100° C. to render the ceramic green sheets constituting the stacked compact integral with one another.

Next, after the stacked compact was cut into a 18 mm-long rectangular prism having a square cross section of a dimension of 8 mm by 8 mm, binder removal treatment was carried out for 10 hours at a temperature of 800° C., and also firing was carried out for 2 hours at a temperature of 1130° C. In this way, a stacked body was obtained. An MgO-made bowl having a hermetic structure was used as a firing bowl in the firing, and ceramic powder having the same composition as the stacked compact and the ceramic included in the stacked compact was put in the bowl with subsequent firing to obtain the stacked body. Note that, in the stacked body, the thickness of piezoelectric body constituting the active section and the inactive sections was set at 100 μm.

Next, each of the four side surfaces of the stacked body was ground by a thickness of 0.2 mm at a time by a surface grinder. At this time, the grinding was performed so that the ends of the internal electrodes can be exposed alternately at two side surfaces of the stacked body; that is, the end of the internal electrode 3a can be exposed at the external electrode 4a-side side surface of the stacked body, whereas the end of the internal electrode 3b can be exposed at the external electrode 4b-side side surface of the stacked body. Then, an electrically conducting paste composed of an admixture of silver, a binder, a plasticizer, and glass powder was printed onto the side surface of the stacked body by screen printing with subsequent firing at a temperature in the range of 600 to 800° C. In this way, a conductor layer was formed. Moreover, the conductor layer was, at its outer surface, bonded to the SUS-made plate-like external electrode 4a, 4b plated with silver for connection with an external power source by an electrically conducting adhesive (polyimide-based resin having a Ag content of 30 to 80 vol %) and solder in conformity with the standard listed in Table 1.

After that, a lead was connected to the external electrode by solder, and then epoxy-based resin, as well as silicone-based resin, was applied to the bonded end portion of the external electrode bonded to the conductor layer by a dispenser in conformity with the standard listed in Table 1 with subsequent curing for 1 hour at a temperature of 200° C. In this way, multi-layer piezoelectric elements 1 were obtained.

Lastly, a polarization voltage of 2 kV/mm was applied to the multi-layer piezoelectric element to initiate polarization in the piezoelectric bodies as a whole constituting the multi-layer piezoelectric element. In this way, a multi-layer piezoelectric element according to the invention was obtained.

Where the item of "Presence of resin at bonded end portion" listed in Table 1 is concerned, the term "Absent" indicates that no resin exists; "Only lead-connected end" indicates that resin exists only at the bonded region of the external electrode which is bonded to the conductor layer in the area near one end (feeding end); and "Both ends" indicates that resin exists at the opposite bonded regions in the stacking direction of the external electrode bonded to the conductor layer.

Moreover, where the item of "Application position" listed in Table 1 is concerned, the term "Inactive section" indicates that resin exists on the inactive section; "Active section-inactive section interface" indicates that resin lies across the active section and the inactive section; and "Beyond end" indicates that part of the end face of the stacked body and part of the protrusion of the external electrode are bonded to each other by resin.

Further, where the item of "External electrode" listed in Table 1 is concerned, the term "SUS plate with slits" means a SUS-made external electrode having a number of alternating slits formed so as to extend from their respective long sides of the external electrode toward the center thereof, with the tips of the slits disposed in overlapping relation when viewed in the stacking direction of the stacked body; and "SUS plate with slits and holes" means a SUS-made external electrode having, in addition to slits, holes that are each formed in the location between the overlapping tips of the slits when viewed in the stacking direction so as to extend along the longitudinal axis of the slit. Moreover, when the external electrode was bonded with the conductor layer by an electrically conducting adhesive, there was no special indication, whereas when the external electrode was bonded to the conductor layer by solder, the term "soldered" was indicated.

The multi-layer piezoelectric elements thus obtained have each been subjected to application of DC voltage of 200 V. The result showed that each of the multi-layer piezoelectric elements underwent displacement of 10 μm (initial displacement) due to expanding and contracting behavior in driving operation. In the measurement of displacement, with each sample held in place on a vibration-proof table, aluminum foil was stuck on the top surface of the sample. Then, the element was measured at its three positions, namely the center and the opposite ends, by a laser displacement gage. The mean value of the amounts of displacement at the three positions was defined as the displacement of the multi-layer piezoelectric element.

Moreover, a driving test was conducted on each of the multi-layer piezoelectric elements under conditions of application of alternating electric fields of 0 V to +200 V at a frequency of 200 Hz and a temperature of 180° C. In the driving test, following the completion of 1×109 cycles of continuous driving operation of the multi-layer piezoelectric element, displacement measurement was conducted to examine a change from the initial displacement. More specifically, there were prepared 10 test pieces per sample for evaluation. The one that exceeded 0.5 μm in respect of the absolute value of displacement change was judged as defective, and the number of defective pieces was counted.

It is noted that, as a comparative example, there was formed a multi-layer piezoelectric element in which no resin was applied to the bonded end portions of the external electrode bonded to the conductor layer (Sample No. 1). In the same manner as in the multi-layer piezoelectric elements of Sample Nos. 2 through 7, the measurement of initial displacement and the driving test were performed on Sample No. 1.

TABLE 1

| Sample No. | Presence of resin at bonded end portion | Type of resin | Application position | External electrode plate | Displacement evaluation after $1 \times 10^9$ cycles |
|---|---|---|---|---|---|
| *1 | Absent | — | — | SUS plate with slits | 10/10 |
| 2 | Only lead-connected end | Epoxy | Inactive section | SUS plate with slits | 1/10 |
| 3 | Both ends | Epoxy | Inactive section | SUS plate with slits | 0/10 |
| 4 | Both ends | Silicone | Inactive section | SUS plate with slits | 1/10 |
| 5 | Both ends | Epoxy | Active section-inactive section interface | SUS plate with slits | 0/10 |
| 6 | Both ends | Epoxy | Beyond end | SUS plate with slits | 0/10 |
| 7 | Both ends | Epoxy | Inactive section | SUS plate with slits and holes | 0/10 |
| 8 | Both ends | Epoxy | Inactive section | SUS plate with slits (soldered) | 0/10 |
| 9 | Both ends | Epoxy | Inactive section | SUS plate with slits | 0/10 |

Asterisk (*) indicates sample out of scope of the invention

It has been found that, in each of the multi-layer piezoelectric elements of Sample Nos. 2 through 7 of the invention, none of the 10 test pieces exceeded 0.5 μm in respect of the absolute value of difference between the initial displacement and the displacement as observed after 1×109 cycles of continuous driving operation.

By contrast, it has been found that the multi-layer piezoelectric element of Sample No. 1 suffered from damage to the connected portion of the external electrode due to heat generation.

It should be noted that the invention is not limited to the embodiments and examples as described hereinabove, and therefore various changes and modifications may be made without departing from the gist of the invention.

REFERENCE SIGNS LIST

1: Multi-layer piezoelectric element
12: Lead pin
13, 14: Resin
2: Stacked body
2a: Active section
2b: Inactive section
21, 22: Piezoelectric body
3a, 3b: Internal electrode
4a, 4b: External electrode
5a, 5b: Conductor layer

What is claimed is:

1. A multi-layer piezoelectric element, comprising:
a stacked body configured to include an active section in which piezoelectric bodies and internal electrodes are alternately laminated, and inactive sections arranged at both ends of the active section, each of the inactive sections comprising additional piezoelectric bodies;
a conductor layer disposed coveringly on a side surface of the stacked body so as to be elongated in a stacking direction of the stacked body to electrically connect with ends of the internal electrodes, which are extended to the side surface of the stacked body; and
an external electrode disposed on the conductor layer so as to be elongated in the stacking direction of the stacked body, the external electrode having a feeding end and the other end distal to the feeding end in the stacking direction,
wherein the conductor layer and the external electrode are each extended from the active section to the inactive sections,
a resin is disposed so as to cover a bonded region of the external electrode, which is bonded to the conductor layer at the feeding end located in one of the inactive sections, and
another bonded region of the external electrode, which is located in the active section and extends between the feeding end located in the one inactive section and the other end located in the other of the inactive sections, is resin-free.

2. The multi-layer piezoelectric element according to claim 1, further comprising another resin disposed so as to cover another bonded region of the external electrode in the other of the inactive sections, which is bonded to the conductor layer at the other end distal to the feeding end.

3. The multi-layer piezoelectric element according to claim 1, wherein the external electrode is so disposed as to have a protrusion on its feeding-end side, the protrusion extending beyond an end face of the stacked body, and
part of the end face of the stacked body and part of the protrusion of the external electrode are bonded to each other by the resin.

4. The multi-layer piezoelectric element according to claim 1, wherein the resin is an epoxy-based resin.

5. The multi-layer piezoelectric element according to claim 1, wherein the bonded region of the external electrode is provided with a hole, the hole being filled with the resin.

6. The multi-layer piezoelectric element according to claim 1, wherein the external electrode is bonded to the conductor layer via an electrically conducting resin.

7. The multi-layer piezoelectric element according to claim 1, wherein the feeding end of the external electrode is covered with the resin.

8. An injection device, comprising:
a container provided with an injection hole; and
the multi-layer piezoelectric element according to claim 1,
a fluid stored in the container being injected through the injection hole by driving the multi-layer piezoelectric element.

9. A fuel injection system comprising:
a common rail configured to store a high-pressure fuel;
the injection device according to claim 8, the injection device being configured to inject the high-pressure fuel stored in the common rail;
a pressure pump configured to supply the high-pressure fuel to the common rail; and
an injection control unit configured to send a drive signal to the injection device.

* * * * *